(12) United States Patent
Delaruelle et al.

(10) Patent No.: US 6,424,680 B1
(45) Date of Patent: Jul. 23, 2002

(54) INTERLEAVING WITH LOW-SPEED MEMORY

(75) Inventors: Antoine Delaruelle; Franciscus A. M. Van De Laar, both of Eindhoven (NL)

(73) Assignee: Koninklijke Philips Electroncis N.V., Eindhoven (NL)

( * ) Notice: Subject to any disclaimer, the term of this patent is extended or adjusted under 35 U.S.C. 154(b) by 0 days.

(21) Appl. No.: 08/576,544

(22) Filed: Dec. 21, 1995

(30) Foreign Application Priority Data

Dec. 23, 1994 (EP) .............................................. 94203745

(51) Int. Cl.$^7$ ............................................... H04L 27/04
(52) U.S. Cl. ...................................................... 375/295
(58) Field of Search ................................. 375/262, 295, 375/372, 348; 371/2.1, 39.1, 40.1; 714/786, 787, 762; 711/5, 157

(56) References Cited

U.S. PATENT DOCUMENTS

| | | | | |
|---|---|---|---|---|
| 5,276,827 A | | 1/1994 | Delaruelle et al. ........... | 395/400 |
| 5,483,541 A | * | 1/1996 | Linsky ........................ | 371/2.1 |
| 5,592,492 A | * | 1/1997 | Ben-Efraim et al. ......... | 371/2.1 |

OTHER PUBLICATIONS

A.A. Elimam, "A Decision Sypport System (DSS) for Agricultural Pesticide Production Planning", European Journal of Operational Research, vol. 81, No. 1, 16, Feb. 1995, pp. 17–34.

Lacaze Et Al: "C2H2F2: Case Comprehensive Hybrid–Hybrid Forecasting Framework" Proceedings INRIA/IEEE Symposium on Emerging Technologies and Factory Automation, vol. 1, 10–13, Oct. 1995, PPGS. 701–708.

Randhawa Et Al: "A Decision Aid for Coordinating Fishing and Fish Processing", European Journal of Operational Research, vol. 81, No. 1, Feb. 16, 1995, PPGS. 62–75.

Huisken et al., "Specification, Partitioning and Design of a DAB Channel Decoder", *VLSI Special Processing, VI*, pp. 21–29.

* cited by examiner

*Primary Examiner*—Tesfaldet Bocure
(74) *Attorney, Agent, or Firm*—Michael E. Belk

(57) ABSTRACT

A digital signal is interleaved by delaying samples thereof by an integral number times a unit delay in accordance with a cyclically repeated delay pattern (AL91) . . . AL(M) Select lines (AL91) . . . AL(M)) of a memory (HAS) are cyclically activated (HAS) at a cycle rate equal to unit delay. During the activation of a select line, both data is written and read from the memory. The data written comprises a relevant bit of each sample to be delayed in an integral number of sample groups. Each sample group is associated with one delay pattern cycle. The data read (b(1,1,j)@a1 . . . b(1,M,j)@aM . . . b(k,1,j)@a1 . . . b(k,M,j)@aM) comprises a number of bits which is equal to the number of bits written. The bits are read in accordance with the delay pattern. Accordingly, the speed requirements imposed on the memory (MEM) are relatively lax.

10 Claims, 6 Drawing Sheets

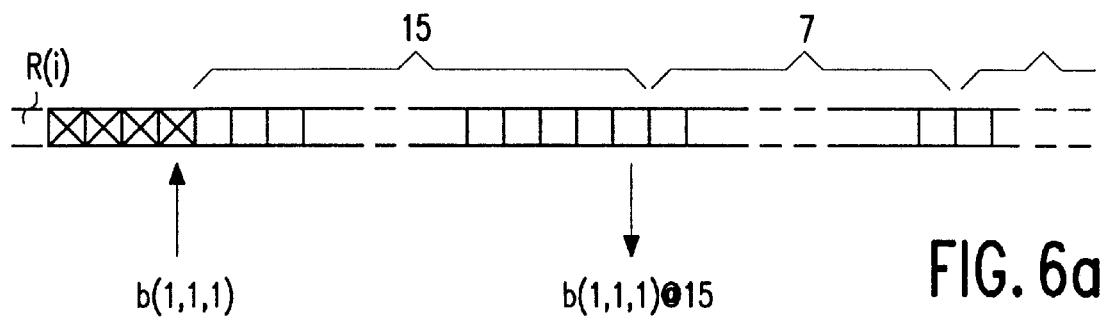
FIG. 5
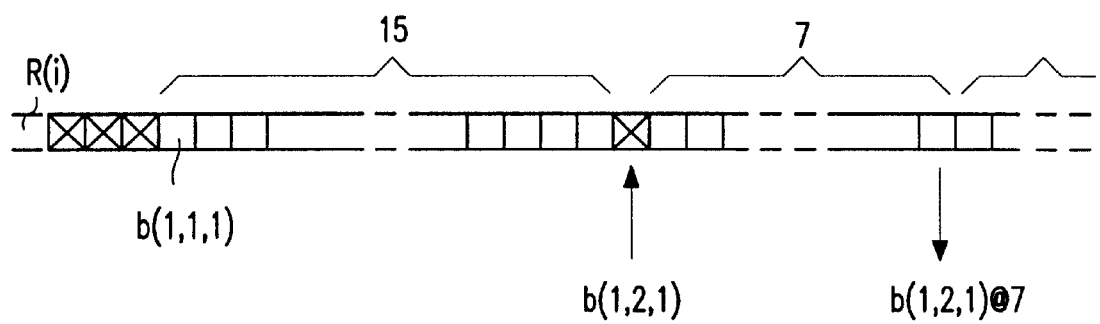
FIG. 6a
FIG. 6b
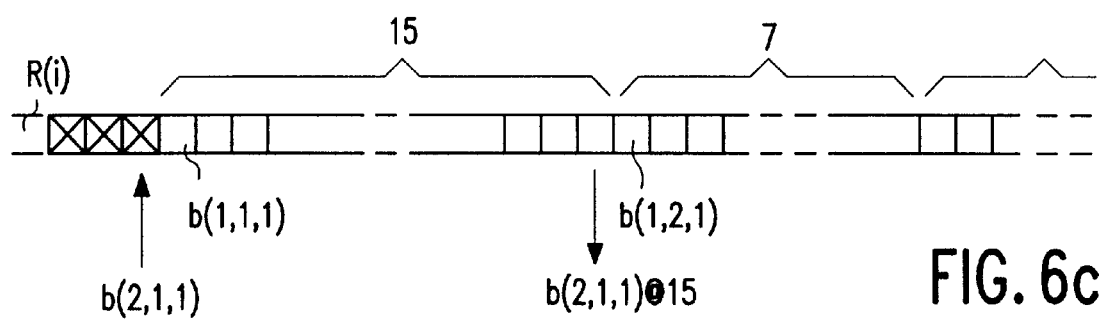
FIG. 6c
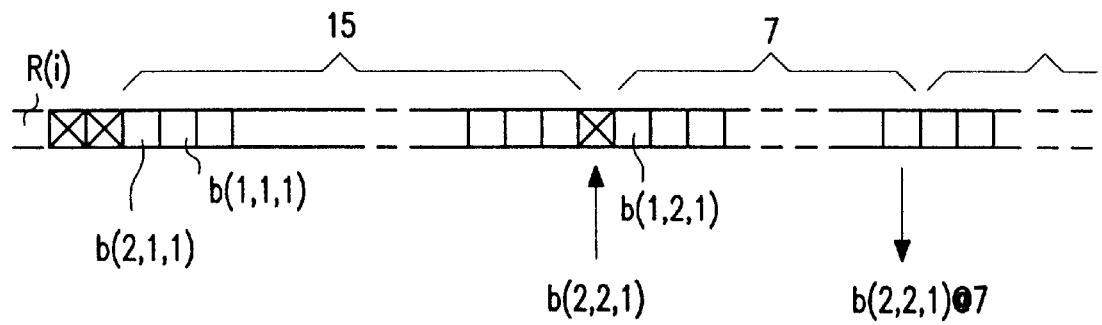
FIG. 6d

INTERLEAVING WITH LOW-SPEED MEMORY

BACKGROUND OF THE INVENTION

The invention relates to a method of interleaving. Interleaving is the process of changing the sequence of samples in a data stream.

The invention may be used, inter alia, in receivers and transmitters, in particular for Digital Audio Broadcast (DAB) or Digital Video Broadcast receiver (DVB). In a transmitter, a digital signal to be transmitted can be interleaved. Accordingly, in a corresponding receiver, a digital baseband signal should be in a manner interleaved complementary to restore the original sequence of samples. In information transmission, interleaving helps to counteract deficiencies in the channel via which the information is transmitted. For example, in mobile reception of a radio signal there is fading which may cause a burst of errors in the demodulated signal. These errors are dispersed by interleaving the demodulated signal. Dispersed errors can be corrected by means of appropriate decoding techniques.

The invention may be embodied in an interleaving arrangement comprising a memory and a memory control unit. The invention may also be embodied in a memory control unit as such, for example, in the form of an integrated circuit. The memory control unit itself may comprise a memory in which instructions are stored for carrying out a method of interleaving according to the invention.

More specifically, the invention relates to a method of interleaving a digital signal as defined in the pre-characterizing part of Claim 1. Such a method is part of a DAB standard laid down in ETSI PRETS 3041 Final Draft. According to the DAB standard, a convolutional encoded datastream is interleaved at the transmitter side. The process of restoring the original sample sequence at the receiving side is referred to as de-interleaving. It should be noted that in this specification the term interleaving is used as a generic term which also includes de-interleaving.

The DAB method of interleaving at the transmitter side is illustrated in FIG. 1 of the application. Subsequent samples of a convolutional encoded datastream DB are delayed in accordance with a cyclically repeated delay pattern. This delay pattern is represented by an array of 16 rectangles in FIG. 1 which functionally represent 16 different delays. Each delay is an integral number of times the duration of a frame into which a DAB signal can be subdivided. The duration of a frame, denoted as FR in FIG. 1, can be considered as a unit delay. This unit delay depends on the DAB system mode in accordance with which the information is transmitted. The unit delay is 24 milliseconds.

The DAB method of interleaving functionally proceeds as follows. When a certain sample occurs in the convolutional encoded datastream DB, say sample S1, the switches SWI and SWO are in a position as shown in FIG. 1. Accordingly, sample S1 is delayed zero times the unit delay, that is, sample S1 is not delayed. When a subsequent sample occurs, say sample S2, switches SWI and SWO have moved one position downwards. Accordingly, sample S2 is delayed eight times the unit delay. Switches SWI and SWO continue to move one position downwards at each new, subsequent sample which is delayed in accordance with the numeral in the relevant rectangle in FIG. 1. When the 16th sample S16 occurs the switches will connect the bottom rectangle representing a delay of 15 unit delays. Subsequent to this position, switches SWI and SWO return to the position shown in FIG. 1. Then, the above-described process is repeated, starting with the 17th sample S17. Accordingly, this sample is not delayed like sample S1, the 18th sample S18 eight times the unit delay, and so on.

SUMMARY OF THE INVENTION

The above citations are hereby incorporated in whole by reference.

An object of the invention is, to provide a method of interleaving as identified above, which can be performed with a relatively low speed memory. Such a method is defined in Claim 1. In addition, the invention provides a receiver as defined in Claim 2, a transmitter as defined in Claim 3 an interleaving arrangement as defined in Claim 4, and a memory control unit as defined in Claim 5.

Briefly, in the invention select lines of a memory are cyclically activated at a cycle rate equal to unit delay. During the activation of a select line both data is written and read from memory locations coupled to the select line. The data written comprises a relevant bit of each sample to be delayed in an integral number of sample groups. Each sample group is associated with one delay pattern cycle. The data read comprises a number of bits which is equal to the number of bits written. The bits are read in accordance with the delay pattern.

Accordingly, for most memory accesses a newly accessed memory location is coupled to an identical select line as the previously accessed memory location. Such accesses require one clock cycle. In the invention random accesses are kept to a minimum. Random accesses are accesses for which two new mutually rectangular select lines, i.e. a row and a column, have to be activated. In a DRAM memory, this requires two clock cycles or more. When only one new select line has to be activated, one clock cycle suffices.

Hence, in the invention the average number of clock cycles needed for a memory access is close to one. The lower this average number of clock cycles, the more relaxed the speed requirement on the memory. This can be explained as follows.

The sample or bit rate of the digital signal to be interleaved determines the required number of accesses in a given time-span, say, one second. The higher the average number of clock cycles for a memory access, the more clock cycles are needed in one second to effectuate the clock frequency required number of accesses. This means that the needs to be higher, because the clock frequency is equal to the number of clock cycles in one second. Hence, a lower speed memory can perform interleaving if the average number of clock cycles for an access is lowered.

It may seem illogical that the storage capacity of the memory is not fully exploited, which will be the case in most practical applications of the invention. In commercially available memories, the number of memory locations coupled to a select line, i.e. a row or a column, is usually fixed and equals a power of two, for example 512. Generally, not all of these available memory locations will be used in the invention. This is a consequence of writing bits of an integral number of sample groups (integer) on a row or a column repetitively each unit delay. The integer is the only parameter for varying the total number of bits stored on a row or column. Generally, there will be no integer with which all available memory locations are used. Either the integer is such that some available memory locations are unused, or the integer is such that the number of bits stored exceeds the storage capacity of a row or column.

In addition to interleaving with low speed memories, the invention provides other notable features. These include low power operation, avoidance of memory refresh cycles, and relatively few and simple address calculations.

BRIEF DESCRIPTION OF THE DRAWINGS

These and other aspects of the invention will be apparent from and elucidated with reference to the embodiments described hereinafter in conjunction with the drawings, in which:

Those skilled in the art will understand the invention and additional objects and advantages of the invention by studying the description of preferred embodiments below with reference to the following drawings which illustrate every feature of the appended claims:

FIG. 5 illustrates the partitioning of data on a row of an interleaving memory.

FIGS. 6a to 6d illustrate the reading and writing of data on the row.

DESCRIPTION OF THE PREFERRED EMBODIMENTS

First, the basic principle of the invention will be further explained. Next, an application of the invention in a DAB receiver will be described by way of example. Subsequently, notable features of the invention will be highlighted with reference to this example. Finally, some variants of the example shown will be dealt with.

Figure 2A:
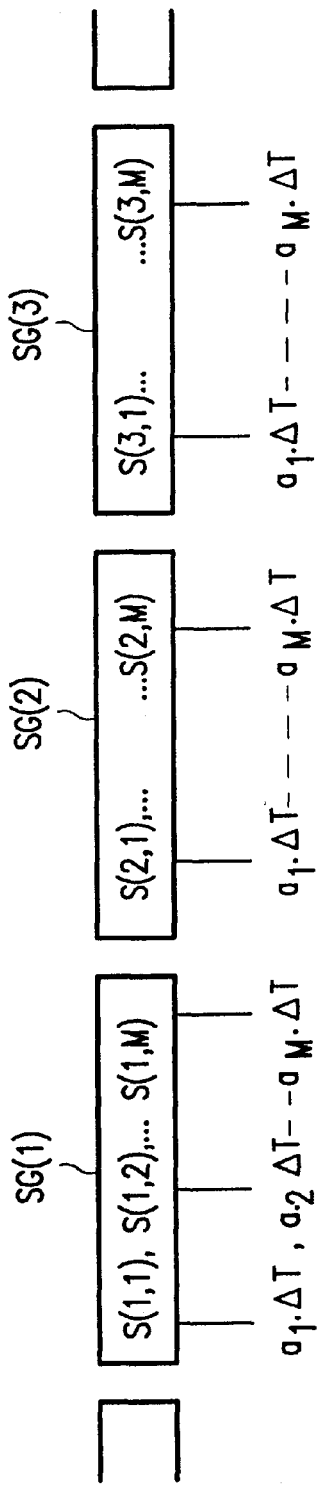
FIGS. 2a and 2b show the structure of a datastream to be interleaved.

FIG. 2a illustrates the structure of a digital signal to be interleaved. The digital signal can be sub-divided into groups of symbols SG(1), SG(2), etc. Each group can be associated with one cycle of a cyclically repeated sample delay pattern. Referring to symbol group SG(1), the delay pattern for interleaving is as follows. The first sample of this group S(1,1) is to be delayed an integer a1 times a unit delay $\Delta T$. The subsequent sample S(1,2) is to be delayed with a delay time of a2·$\Delta T$, and so on. Finally, the last sample S(1,M) of symbol group SG(1,M) is to be delayed aM times unit delay $\Delta T$. For the next group of samples SG(2), the delay pattern a1·$\Delta T$ . . . aM·$\Delta T$ is repeated, accordingly.

Figure 2B:
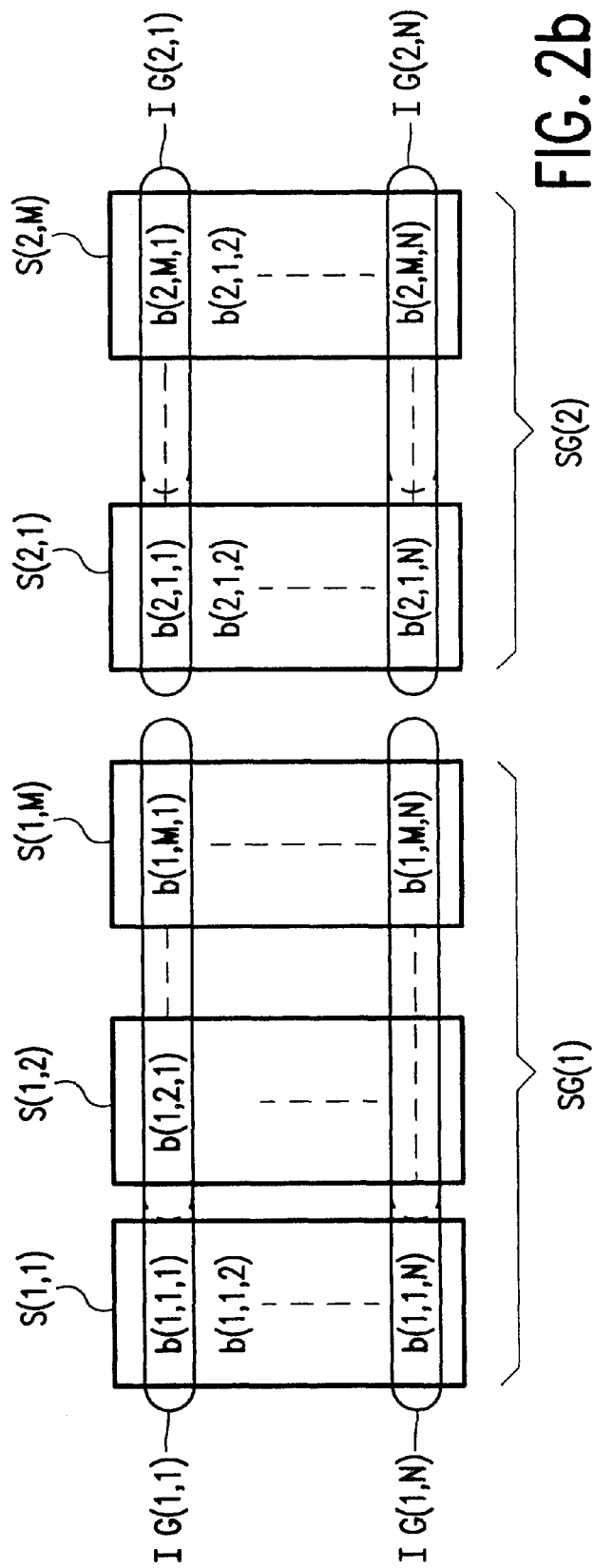

FIG. 2b shows the data in symbol group SG(1) in more detail. Each sample S(1,1) . . . S(1,M) consists of N bits, that is, sample S(1,1) comprises bits b(1,1,1), b(1,1,2) . . . b(1,1,N). Similarly, sample S(1,M) comprises bits b(1,M,1) . . . b(1,M,N). The bits belonging to sample group SG1 can be grouped into interleaving bit groups IG(1,1) . . . IG(1,N). For each sample S(1,1) . . . S(1,M) one bit is taken to form such an interleaving bit group. For example, interleaving bit group IG(1,1) comprises bits b(1,1,1), b(1,2,1) . . . b(1,M,1). Each bit in an interleaving bit group has to be delayed with a unique delay time. Moreover, the delay times which can be associated with each bit in the group correspond to the delay pattern for interleaving.

It should be noted that there are basically two ways in which bits of a sample can be physically arranged: time-multiplex or line-multiplex. In a time-multiplex arrangement there is one line which carries all the bits of the signal to be interleaved. For example, bits b(1,1,1), b(1,1,2), . . . b(1,1,N) subsequently occur on the single line, defining the value of sample S(1,1). In a line-multiplex arrangement there are N lines, each line carrying a relevant bit of a sample. For example, bits b(1,1,1), b(1,1,2), . . . b(1,1,N) occur simultaneously, with each bit on a specific line L1,L2, . . . Ln, respectively. Of course, it is possible to conceive intermediate ways of physically arranging sample bits.

Figure 3:
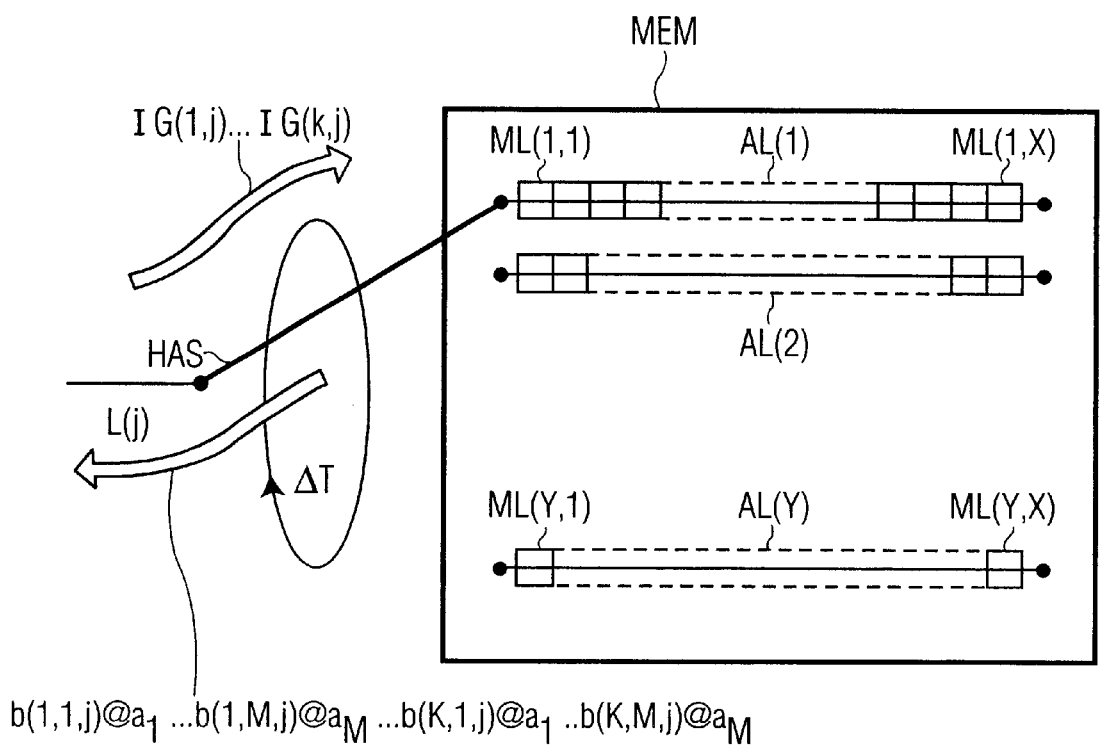
FIG. 3 illustrates the basic principle of the invention.

FIG. 3 illustrates the basic principle of the invention for a case in which sample bits are arranged in line-multiplex. In FIG. 3, input line L(j) carries relevant sample bits of the signal to be interleaved. The value of integer j defines which sample bits are involved. For example, line L(1) carries bits b(1,1,1), b(1,2,1) . . . b(1,M,1) of the samples S(1,1), S(1,2) . . . S(1,M) shown in FIG. 2b. Accordingly, line L(N) carries bits b(1,1,N) . . . b(1,M,N).

A memory MEM is coupled to the line L(j). The memory MEM comprises a matrix of select lines, say, horizontal and vertical select lines. Each memory location ML is coupled to a specific combination of a horizontal and a vertical select line. A specific memory location is accessed when both select lines coupled thereto are activated. FIG. 3 shows some of the horizontal select lines; the vertical lines are not shown. A plurality of X memory locations with X being an integer, is coupled to the horizontal select lines for example, memory locations M(1,1) . . . M(1,X) are coupled to select line AL(1).

Each horizontal select line AL(1) . . . AL(Y) in the memory is cyclically activated at a repetition rate which is equal to unit delay $\Delta T$. This is visualized in FIG. 3 by means of switch HAS which cyclically connects each select line AL(1) . . . AL(Y) to the line L(j). The connection of a select line to lines L(j) via the switch HAS means that this select line is activated. Consequently, data can be written in and read from memory locations coupled to that select line. FIG. 3 shows a state in which select line AL(1) is activated.

The method of interleaving proceeds as follows. In the state shown in FIG. 3, a number of K interleaving bit groups IG(1,j) . . . IG(K,j) are written in memory locations M(1,1) . . . M(1,X), K being an integer. This is visualized in FIG. 3 by an arrow pointing towards memory MEM denoted by IG(1,j) . . . IG(K,j). For example, if j=1, the bit interleaving group IG(1,1) of sample group SG(1) shown in FIG. 2b is written. If, in addition, K=2, the interleaving bit group IG(2,1) is equally written.

When switch HAS has moved one position downwards, select line AL(2) is activated. In that state, the following K bit interleaving groups IG(K+1,j) . . . IG(2·K,j) are written in memory locations coupled to select line AL(2). For example, if j=1 and K=1, bit interleaving group IG(2,1) shown in FIG. 2b is written in memory locations coupled to select line AL(1). However, if K had equalled 2, bit interleaving groups IG(3,1) and IG(4,1), not shown in FIG. 2b, would have been written.

Switch HAS continues to move to new positions until after one unit delay $\Delta T$ it returns to the positions as shown in FIG. 3. Then, the cycle is repeated and new data is stored.

During the activation of a select line, data is also read from memory locations coupled thereto. The data can be read in accordance with the interleaving delay pattern. This is possible because the data storage time is an integral number of times unit delay $\Delta T$ due to the fact that data is cyclically written each unit delay $\Delta T$.

For example, consider the state shown in FIG. 3 in which bit interleaving bit groups IG(1,j) . . . IG(K,j) are written as described above. In accordance with the delay pattern a1·ΔT ... aM·ΔT of FIG. 2a, the following data is read from the memory location coupled to select line AL(1). First, the bit corresponding to the bit b(1,1,j) which was written a1 cycles of switch HAS ago is read. This bit is denoted as b(1,1,j)@a1 and has been stored for a duration of a1·ΔT. Subsequently, a bit corresponding to bit b(1,2,j) is read which has been stored for a duration of a2·T, that is, bit b(1,2,j)@a2. Accordingly, other memory locations in which bits b(1,3j)@a3 ... b(1,M,j)@aM have been stored are read. If K is larger than one, the same relevant delayed bits are read which correspond to the interleaving bit group IG(2,j). The read-out is generically illustrated in FIG. 3 by an arrow pointing away from memory MEM denoted as b(1,1,j)@a1 ... b(1,M,j)@aM ... b(K,1,j)@a1 ... b(K,M,j)@aM.

As a result of reading storage data as described above, memory locations become vacant. Advantageously, the reading of memory locations precedes the writing when a select line such as, for example, AL(1) is selected. The memory locations which have become vacant are used to write new interleaving bit groups, for example, IG(1,j) ... IG(K,j) as shown in FIG. 3.

In principle, it does not matter in which memory locations individual bits of an interleaving bit group are actually written. Of course, relevant data which is to be read in one of the following activations of a horizontal select line should not be overwritten. The actual memory locations from which bits are read and in which bits are written are determined by the activation of the vertical select lines not shown in FIG. 3. The scheme of this activation will be further referred to as a vertical addressing scheme. The vertical addressing scheme should, of course, be in conformity with the desired interleaving delay pattern. In a sense, it must keep track of the storage time of the data to read the correct sequence of output bits. An advantageous vertical addressing scheme has been described in PHN 13.007 (U.S. Pat. No. 5,276,827) and will not discussed in further detail.

In some cases, a sample in a sample group does not need to be delayed. It will be evident that the bits of this sample do not need to be stored in the memory MEM shown in FIG. 3. For example, let the integer a1 shown in FIG. 2a equal zero. In that case, only bits b(1,2,.) ... b(1,M,.) of sample group SG(1) are written into memory MEM shown in FIG. 3. Bit b(1,1,.) is then no longer part of the bit interleaving groups IG(1,1) ... IG(1,N) shown in FIG. 2b, which is indicated by the dashed lines. Of course, the same then applies to other bit interleaving groups.

However, even if one bit of an interleaving bit group does not need to be delayed, it can nevertheless be stored. All integers a1 ... aM can be augmented with the same amount without this affecting the interleaving as such. The only effect will be an additional delay in the output signal as a result of interleaving.

By way of example, an application of the invention in a DAB receiver will now be presented. For details on DAB reference is made to the article "Specification, Partitioning and Design of a DAB channel decoder" in IEEE Special Publication VLSI Signal Processing VI, pp. 21–29.

Figure 4:
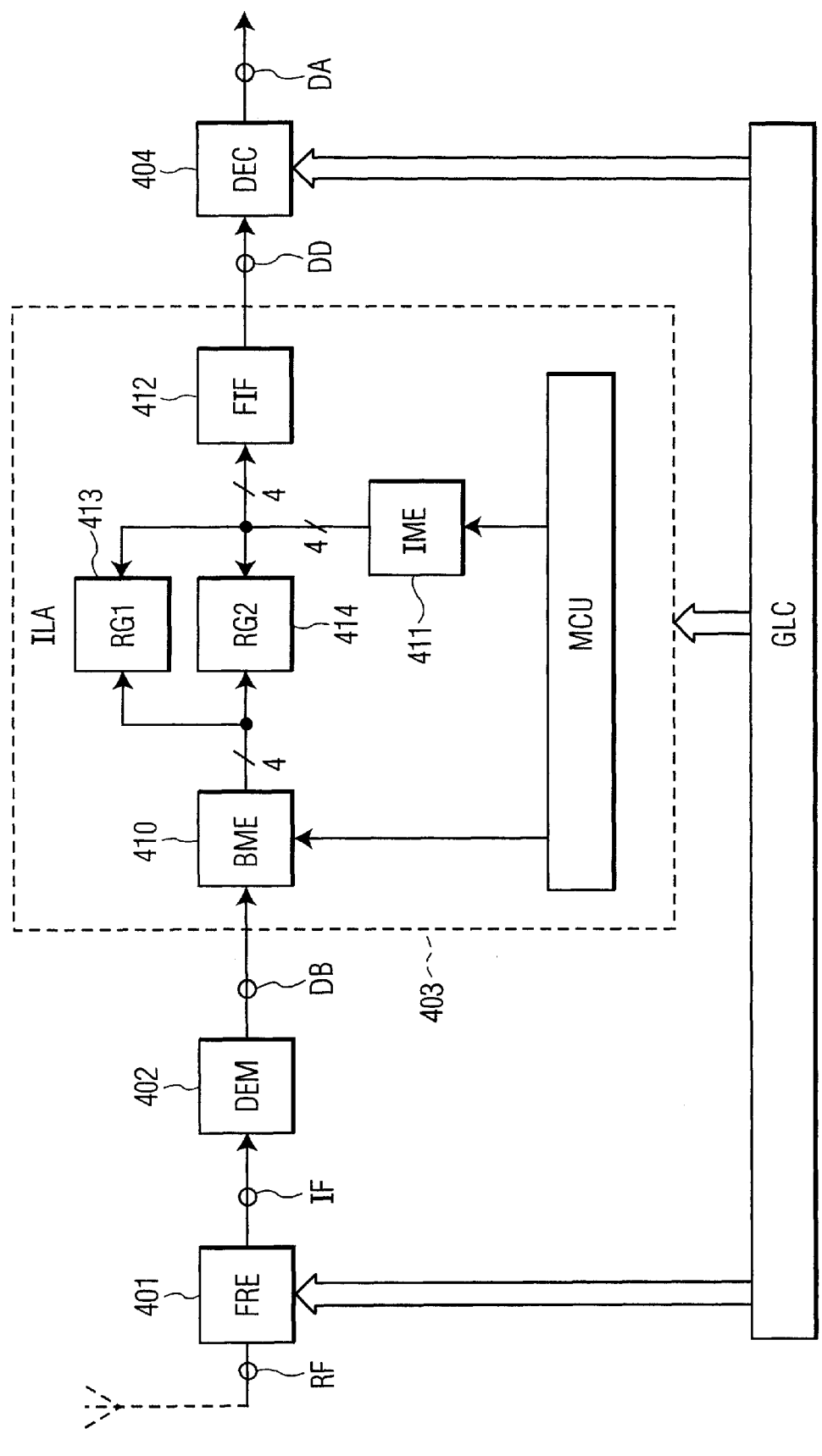
FIG. 4 is an example of a receiver according to the invention in a block-schematic diagram.

FIG. 4 shows DAB receiver 400 in which the interleaving method according to the invention is applied. Front end FRE 401 converts a received DAB modulated carrier RF into an intermediate frequency DAB signal IF from which demodulation section DEM 402 derives a DAB-demodulated signal DB. The DAB-demodulated signal DB is de-interleaved by interleaving arrangement ILA 403 which will be explained in further detail. Decoding section DEC 404 derives an error-corrected signal DA, which can be further processed, from the de-interleaved DAB-demodulated signal DD. The digital circuitry of the DAB receiver operates under the control of a global controller GLC which, inter alia, ensures that there are no time-conflicts.

Figure 1:
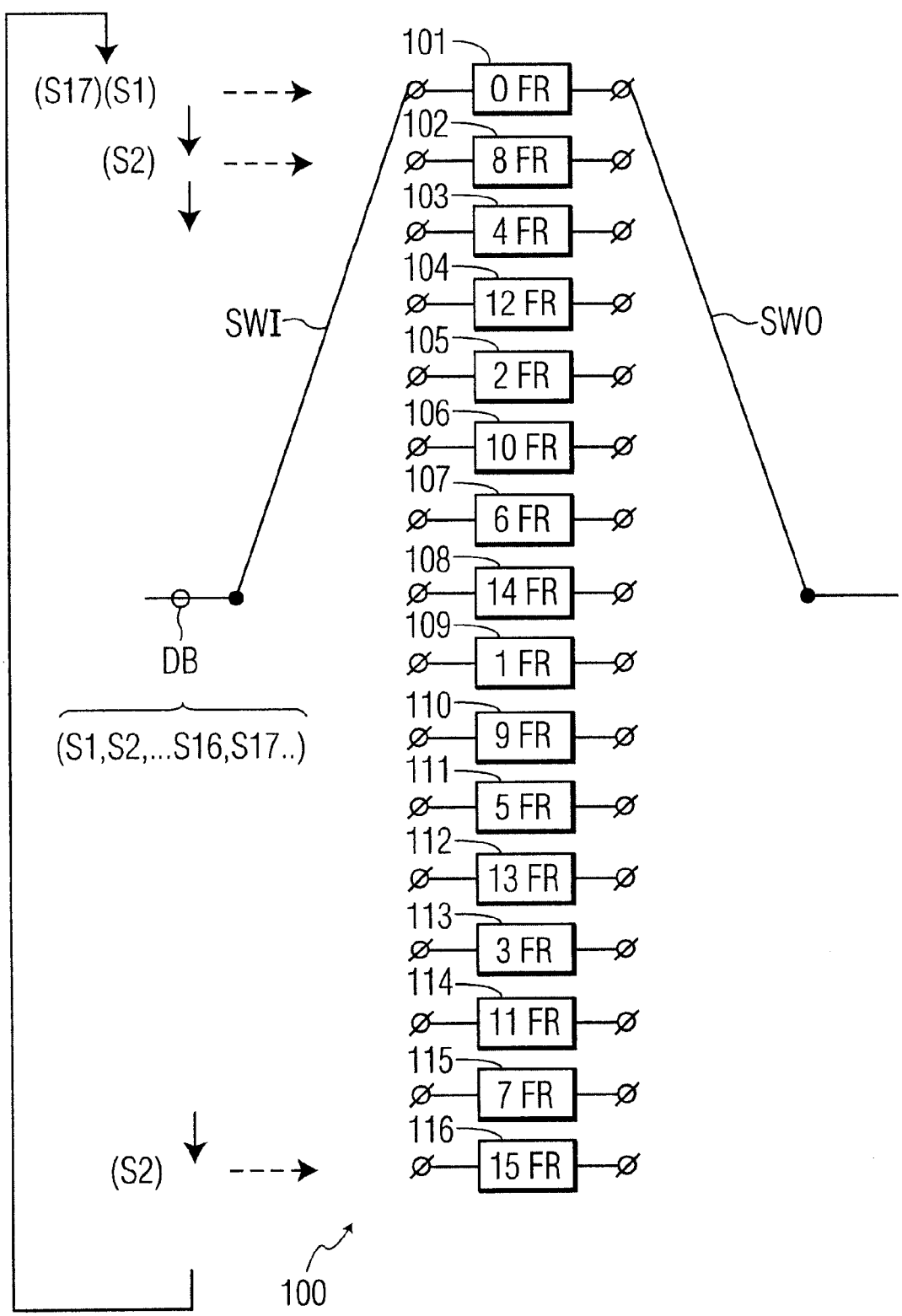
FIG. 1 illustrates interleaving of a convolutional encoded datastream in DAB.

The DAB-demodulated signal DB comprises 4-bit samples which are referred to as metrics in the cited article. Each metric can be associated with a specific sample of the interleaved convolutional encoded datastream DB shown in FIG. 1. Hence, the interleaving delay pattern in the receiver should be complementary to that in FIG. 1.

The DAB-demodulated signal has a structure as shown in FIG. 2a with M=16, N=4 and unit delay ΔT being one frame duration. Thus, there are sample groups SG which comprise 16 metrics. The integers a1, a2, ... a16 are defined in accordance with a delay pattern which is complementary to the delay pattern at the transmitter side shown in FIG. 1. This means that a1=15, a2=7, a3=11, ... ,a15=8 and a16=0 when sample S(1,1) shown in FIG. 2a is associated with sample S1 in FIG. 1.

It should be noted that a capacity unit (CU) in DAB comprises 4 sample groups. Hence, a CU comprise 4×16=64 metrics. In the DAB baseband signal DB there are bursts of an integral number of CUs at regular time-intervals.

In interleaving arrangement ILA 403, buffer memory BME 410 receives CU-bursts in the DAB baseband signal DB and stores the metrics in these bursts. In the interleaving arrangement ILA, the buffer memory BME stores metrics in the DAB-demodulated signal DB and stores these metrics in these bursts. The metrics are read from buffer memory BME and transferred to interleaving memory IME 411 under the control of a memory control unit MCU. The memory control unit MCU also controls the read-out of the metrics stored in the interleaving memory IME. This is in conformity with the de-interleaving scheme shown in FIG. 1. The de-interleaved metrics are supplied to First. In First Out (FIFO) storage device FIF 412. This is done to spread the de-interleaved metrics read from the memory in a burst-like fashion more uniformly in time. The de-interleaved DAB-demodulated signal DD is obtained from the FIFO storage device FIF. The interleaving arrangement ILA further comprises two data registers RG1 413 and RG2 414 which will be further discussed in the specification.

The metrics are supplied to and read from the interleaving memory MEM in line-multiplex. The interleaving memory IME is a 4×256 k DRAM, that is, there are four 256 k DRAM units. Each of the four bits in a metric is stored in a specific 256 k DRAM unit. For example, referring to FIG. 2a for which in DAB n=4 and M=16, bit b(1,1,1) of metric S(1,1) is stored in a first 256 k DRAM unit, bit b(1,1,2) in a second unit, bit b(1,1,3) in a third unit and bit b(1,1,4) in a fourth unit. Each 256 k DRAM unit has 512 columns and 512 rows, each column and row having its own select line. Referring to FIG. 3, in this application AL(1) ... AL(Y) are row select lines for which X=512.

One CU is written on each row of a 256 k DRAM unit for each activation of the row select line, that is, four interleaving bit groups are written: K=4. For example, referring to FIG. 2a, let sample groups SG(1), SG(2), SG(3) and SG(4) constitute a CU in DAB. In the first 256 k DRAM unit, interleaving bit groups IG(1,1), IG(2,1), IG(3,1) and IG(4,1) are stored on a single row, that is, the bits b(.,.,1) in the CU are stored on this row. The bits b(.,.,2) in this CU are stored on a row in the second 256 k DRAM unit. Hence, this row stores interleaving bit groups IG(1,2), IG(2,2), IG(3,2) and IG(4,2). Similarly, bits b(.,.,3) and b(.,.,4) of the CU are stored in the third and the fourth memory unit, respectively.

FIG. 5 illustrates how the storage of bits on a row R(i) is organized. The bits of interleaving bit groups which are to be subjected to the same delay are clustered. Clusters 1, 2, ... 15 comprise bits which are to be delayed a unit delay times the reference numeral of the cluster. For example, cluster 15 comprises bits which are to be delayed 15 times unit delay, that is, 15 frames. The number of bits in a cluster is 4 times the reference numeral, that is, K times the delay in unit delays. Accordingly, cluster 15 comprises 60 bits, cluster 7 comprises 28 bits, each bit occupying a memory location. A total of 480 bits is stored on a row, which means that 480 of the 512 memory locations on a row are effectively used.

FIGS. 6a to 6d illustrate the reading and writing of bits on the row R(i). FIGS. 6a to 6d show details near clusters 15 and 7. Memory locations are represented by squares. A cross in these memory locations denotes a vacancy. During the activation of the row select line, bits to be delayed of interleaving bit groups IG(1,1), IG(2,1), IG(3, 1) and IG(4,1) shown in FIG. 2b are written on row R(i). An equal number of bits are read in accordance with the delay pattern shown in FIG. 1.

In FIG. 6a, the first bit to be delayed b(1,1,1) is written in a vacant memory location adjacent to cluster 15. Further, a bit b(1,1,1)@15 is read from a boundary of cluster 15 which is opposite to the vacant memory location. Bit b(1,1,1)@15 corresponds to bit b(1,1,1) and has been written in row R(i) 15 activations of this row ago. Accordingly, bit b(1,1,1)@15 has been stored for 15 unit delays. Due to the above-described writing and reading, cluster 15 moves one position to the left. This is shown in FIG. 6b.

In FIG. 6b, the next bit b(1,2,1) of interleaving bit group IG(1,1) is written in the memory location which has become vacant due to the reading of bit b(1,1,1)@15. Subsequently, a bit b(1,2,1)@7 is read from a memory location in cluster 7 in which it has been stored for 7 unit delays. Similarly to bit b(1,1,1)@15 in cluster 15, bit b(1,2,1)@7 is at the boundary of cluster 7 opposite to the memory location in which a new bit for cluster 7 is written. The memory location from which bit b(1,2, 1)@7 is read becomes vacant and is subsequently used to write a following bit b(1,3,1), not shown in FIG. 6b. This process of reading and writing bit-by-bit continues likewise for the other clusters on row R(i). FIG. 6c shows the position of clusters 15 and 7 at the moment at when all bits of interleaving bit group IG(1,1) are written. All clusters will have moved one position to the left.

In FIG. 6c, the first bit b(2,1,1) to be delayed of interleaving bit group IG(2,1) is written in a vacant memory location next to the one in which bit(1,1,1) is stored. Similarly to FIG. 6a, a corresponding output bit b(2,1,1)@15 is read. FIG. 6d shows the next read/write step. Bit b(2,2,1) is written in the memory location previously occupied by bit b(2,1,1)@15. FIG. 6d also shows that cluster 15 has again moved one position to the left as compared to FIG. 6c similar to FIGS. 6a and 6b.

When all bits of interleaving bit groups IG(1,1), IG(2,1), IG(3,1) and IG(4,1) have been stored, all clusters on row R(i) will have moved four positions to the left. A new select line of a new row is then activated and a similar read/write process takes place on this row. This row-by-row read/write process continues until row R(i) is newly selected after one unit delay and the read/write process is repeated with new data being written and read. After 7 cycles with reference to FIG. 6a to 6d, bit b(1,2,1) will be read. This bit will then be at the right-hand boundary of cluster 7. It will be clear that all clusters move in the process of interleaving.

Other relevant bits in sample groups, for example IG(1,2), IG(2,2), IG(3,2) and IG(4,2), are processed likewise in a 256 k DRAM unit.

Figure 7:
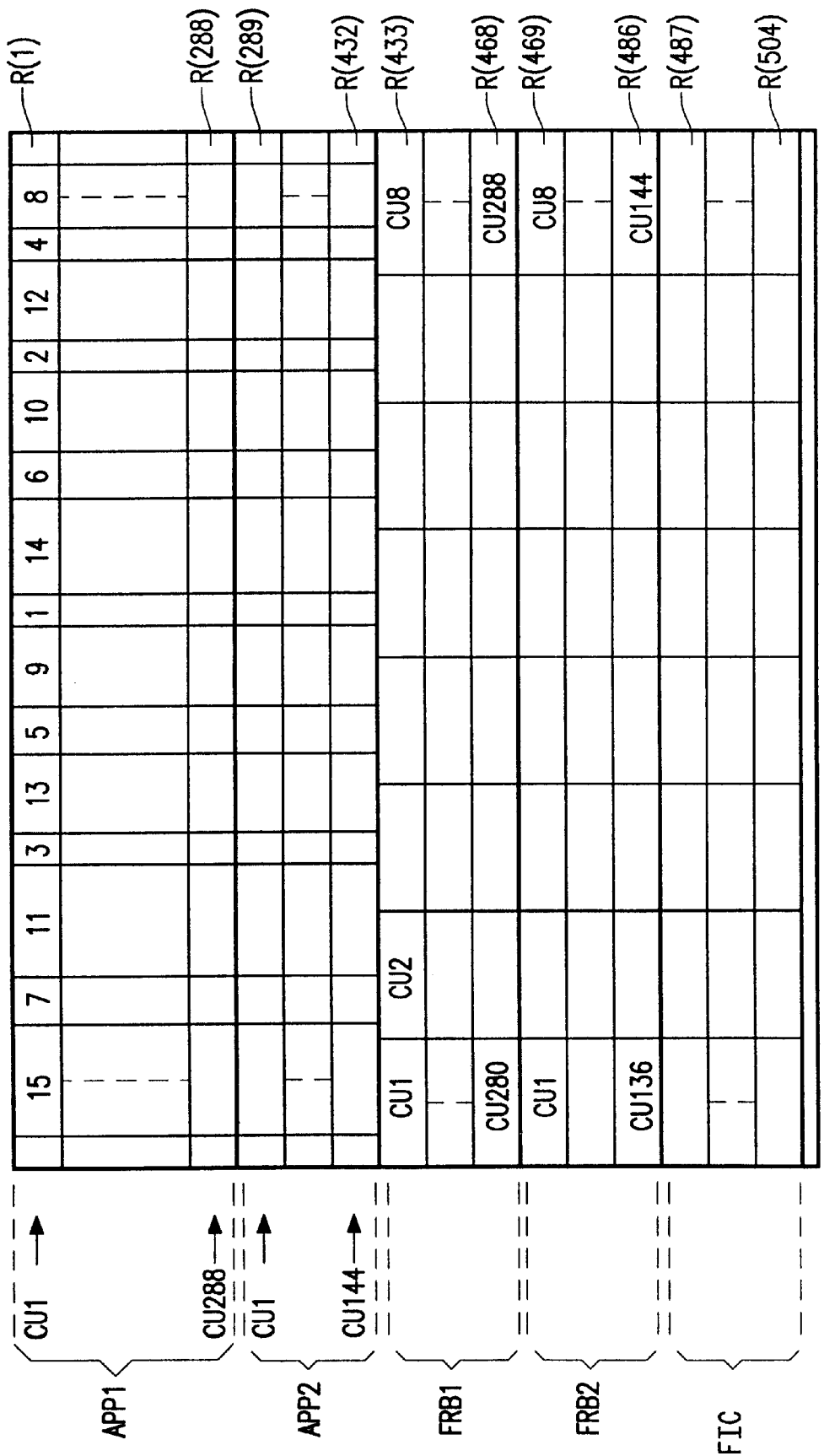
FIG. 7 illustrates the partitioning of data in the interleaving memory for a DAB application.

FIG. 7 shows the partitioning of a 256 k DRAM unit. The partitioning is related to the structure of the DAB-demodulated signal. The DAB-demodulated signal may comprise several types of information, for example, a stereo music program and a mono speech channel. In a frame, a number of CUs is assigned to each type of information. The exact number of CUs assigned will, of course, depend on the bit-rate of the type information to be transmitted. For example, the stereo music program may occupy 288 CUs in a frame, whereas the mono speech channel occupies 144 CUs.

In FIG. 7, rows R(1) to R(288) have been reserved for a first type of information APP1 with 288 CUs per frame. Rows R(289) to R(432) are allotted to a second type of information APP2 with 144 CUs per frame. The memory locations on rows R(433) to R(486) are used to temporarily store de-interleaved data of a frame. Rows R(433) to R(468) and rows R(469) to R(486) constitute frame buffers FRB1 and FRB2, respectively, for the first and the second type of information APP1 and APP2, respectively. A relevant metric bit of eight CU's is stored On each row of these frame buffers, that is, 8 times 64 bits which amounts to 512 bits. The rows R(487) to R(504) store some DAB-specific data called Fast Information Channel (FIC) which is not further discussed.

The de-interleaved data which is read from rows R(1) to R(288) and rows R(289) to R(432), as previously described, is transferred to the respective frame buffer as follows. An input metric is read from the buffer memory BME and written into register RG1 prior to storage in the interleaving memory IME. This leaves a vacant memory space in the buffer memory BME. Simultaneously, four bits are read from the interleaving memory IME and transferred to register RG2. These four bits constitute an output metric for the output signal DD shown in FIG. 4. At the next clock cycle this output metric is written into the vacant memory space of buffer memory BME. At the same clock cycle, the input metric stored in register RG1 is written into interleaving memory IME.

The above-described transfer of metrics continues until all input metrics in the buffer memory BME are replaced by output metrics from the interleaving memory IME. Then, the output metrics are transferred from the buffer memory BME and written in the appropriate frame buffer of interleaving memory IME. Time-conflict is avoided by the global controller GLC shown in FIG. 4. Not all CUs in the DAB-demodulated signal DB need to be processed. During a period in which non-relevant data is supplied by the demodulation section DEM, the above-described internal transfer of data in the interleaving arrangement ILA is effected.

Figure 8:
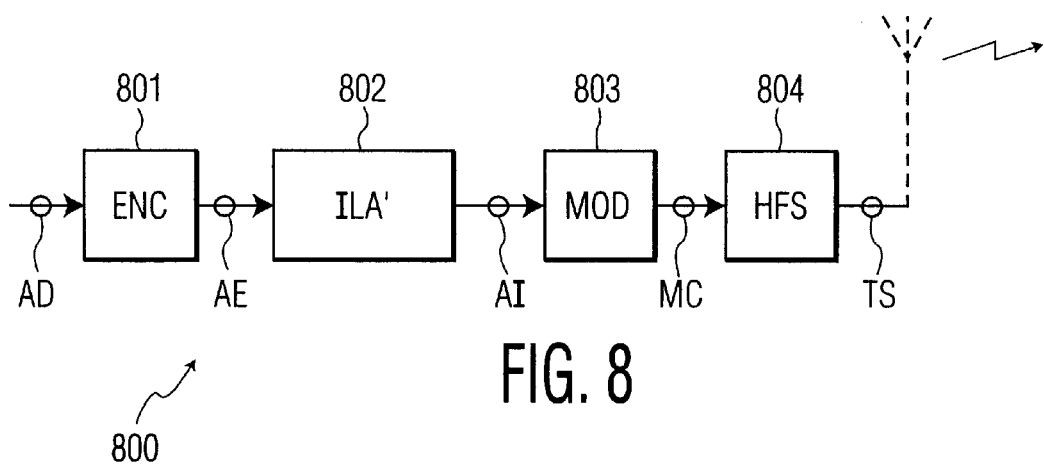
FIG. 8 is an example of a transmitter according to the invention in a block-schematic diagram.

FIG. 8 shows an example of DAB transmitter 800 which operates in accordance with the method of interleaving disclosed in this specification. In a sense, this DAB transmitter is a reversed version of the receiver of FIG. 4. In FIG. 8, encoder ENC 801 encodes a digitized audio signal AD. The encoding is complementary to the decoding in decoder DEC shown in FIG. 4. The encoded digital audio signal AE is interleaved in interleaving arrangement ILA' 802 similar to arrangement ILA shown in FIG. 4 and discussed above. The interleaved and encoded digital audio signal AI is modulated in accordance with to DAB standards in modulator MOD 803. The resultant modulated carrier signal MC is frequency-converted and amplified in high frequency section HFS 804, to provide a DAB transmission signal TS.

Some notable features of the invention will be described with reference to the examples shown.

Relatively low speed memories can be used to perform interleaving. In an experimental DAB receiver shown in FIG. 4, the 4×256 k DRAM memory operated at a clock frequency of 12,288 Mhz. Due to the memory management as described above a burst of metrics equivalent to 48 CUs occurring every 1,246 msec in the DAB- demodulated signal DB could be processed.

The power dissipation in the interleaving arrangement shown in FIG. 4 is relatively low. This is due to the fact that the clock frequency is relatively low and that only one new select line has to be activated for most memory accesses.

No refresh cycles have to be provided for the rows 1 to 432 shown in FIG. 7. Due to the fact that the rows are cyclically selected each unit delay, for DAB 24 milliseconds, the data stored in these rows is automatically refreshed.

The memory control unit MCU shown in FIG. 4 may be relatively simple. Relatively few column positions have to be calculated during the activation of a row select line. This is due to the fact that most memory locations are accessed to both read and write data. This is shown in FIGS. 6a to 6b. In FIG. 6a, bit b(1,1,1)@15 is read at a certain clock cycle. The next clock cycle bit b(1,2,1) is written in the same memory location as shown in FIG. 6b. No new column position has to be determined; the state of the address-generating unit remains unchanged. This is equally favorable for low-power operation.

The storage capacity of the 4×256 k DRAM interleaving memory IME in FIG. 4 is used relatively efficiently. Of the 512 memory locations on rows 1 to 432, 480 are used effectively. It should be noted that the number of memory locations used effectively (NML) can be calculated in accordance with the following formula: NML=K·M·AD, in which AD is the average delay of an interleaving delay pattern. For DAB M=16 and AD=7,5, AD can be readily derived from FIG. 1. By choosing K=4, the percentage of unused storage capacity is kept to a minimum.

While a limited number of embodiments are shown and described by way of example, a person skilled in the art may conceive many other alternative embodiments without departing from the spirit and the scope of the invention claimed.

The invention may also be used advantageously in receivers other than DAB, for example, in Digital Video Broadcast (DVB) receivers. It may be expected that a typical DVB receiver will equally comprise some form of de-interleaving.

A row read/write sequence different from the one illustrated in FIGS. 6a to 6d may be employed. For example, it is possible to first read all the output data before starting a write sequence, or vice versa.

Referring to FIG. 2b, it will be clear that the integer N may be one. This means that, the signal to be interleaved comprises one-bit samples.

It will also be clear that the interleaving memory may be an external RAM as well as an embedded RAM.

It will be evident that where the term select line is used in this specification, this term may alternatively be replaced by row or column. Any reference signs in a Claim cannot be construed as limiting the Claim concerned.

The invention has been disclosed with reference to specific preferred embodiments, to enable those skilled in the art to make and use the invention, and to describe the best mode contemplated for carrying out the invention. Those skilled in the art may modify or add to these embodiments or provide other embodiments without departing from the spirit of the invention. Thus, the scope of the invention is only limited by the following claims:

We claim:

1. A method of interleaving a digital signal in which samples are delayed by an integral number times a unit delay, in accordance with a cyclically repeated delay pattern, comprising the following steps:

cyclically activating parallel-arranged select lines of a memory at a cycle rate which is equal to the unit delay;

writing to the memory, during one activation of a select line, a relevant bit of each sample to be delayed in an integral number of sample groups, a sample group being associated with one delay pattern cycle; and reading from the memory, during the one activation of the select line, a number of bits equal to the number of bits which is written, the bits being read in accordance with the delay pattern;

and in which, data is both written to and read from the memory during consecutive select line activations of the cyclic activations of the select lines for each repeated delay pattern.

2. A method of interleaving a digital signal in which samples are delayed by an integral number times a unit delay, in accordance with a cyclically repeated delay pattern, comprising the following steps:

cyclically activating parallel-arranged select lines of a memory at a cycle rate which is equal to the unit delay;

writing to the memory, during one activation of a select line, a relevant bit of each sample to be delayed in an integral number of sample groups, a sample group being associated with one delay pattern cycle; and reading from the memory, during the one activation of the select line, which data includes a number of bits equal to the number of bits which is written, the bits being read in accordance with the delay pattern;

and in which the data is read and written into the same memory location in one cycle.

3. A receiver for receiving an interleaved digital signal including samples which are delayed by an integral number times a unit delay, in accordance with a cyclically repeated delay pattern, comprising:

means for cyclically activating parallel-arranged select lines of a memory at a cycle rate which is equal to the unit delay;

means for writing to the memory, during one activation of a select line, a relevant bit of each sample to be delayed in an integral number of sample groups, a sample group being associated with one delay pattern cycle; and means for reading from the memory, during the one activation of the select line, a number of bits which is equal to the number of bits written, the bits being read in accordance with the delay pattern;

and in which, data is both written to and read from the memory during consecutive select line activations of the cyclic activations of the select lines for each repeated delay pattern.

4. A receiver for receiving an interleaved digital signal including samples which are delayed by an integral number times a unit delay, in accordance with a cyclically repeated delay pattern, comprising:

means for cyclically activating parallel-arranged select lines of a memory at a cycle rate which is equal to the unit delay;

means for writing to the memory, during one activation of a select line, a relevant bit of each sample to be delayed in an integral number of sample groups, a sample group being associated with one delay pattern cycle; and means for reading from the memory, during the one activation of the select line, a number of bits which is equal to the number of bits written, the bits being read in accordance with the delay pattern;

and in which the data is read and written into the same memory location in one cycle.

5. A transmitter for transmitting a digital signal which is interleaved by delaying samples by an integral number times a unit delay, in accordance with a cyclically repeated delay pattern, comprising:

means for cyclically activating parallel arranged select lines of a memory at a cycle rate which is equal to the unit delay;

means for writing to the memory, during one activation of a select line, a relevant bit of each sample to be delayed in an integral number of sample groups, a sample group being associated with one delay pattern cycle; and means for reading from the memory, during the one activation of the select line, a number of bits which is equal to the number of bits written, the bits being read in accordance with the delay pattern;

and in which, data is both written to and read from the memory during consecutive select line activations of the cyclic activations of the select lines for each repeated delay pattern.

6. A transmitter for transmitting a digital signal which is interleaved by delaying samples by an integral number times a unit delay, in accordance with a cyclically repeated delay pattern, comprising:

means for cyclically activating parallel-arranged select lines of a memory at a cycle rate which is equal to the unit delay;

means for writing to the memory, during one activation of a select line, a relevant bit of each sample to be delayed in an integral number of sample groups, a sample group being associated with one delay pattern cycle; and means for reading from the memory, during the one activation of the select line, a number of bits which is equal to the number of bits written, the bits being read in accordance with the delay pattern;

and in which the data is read and written into the same memory location in one cycle.

7. An interleaving arrangement for interleaving a digital signal in which samples are delayed by an integral number times a unit delay in accordance with a cyclically repeated delay pattern, comprising:

means for cyclically activating parallel-arranged select lines of a memory at a cycle rate which is equal to the unit delay;

means for writing to the memory during an activation of a select line, which data includes a relevant bit of each sample to be delayed in an integral number of sample groups, a sample group being associated with one delay pattern cycle; and means for reading from the memory during the activation of the select line, a number of bits which is equal to the number of bits written, the bits being read in accordance with the delay pattern;

and in which, data is both written to and read from the memory during consecutive select line activations of the cyclic activations of the select lines for each repeated delay pattern.

8. An interleaving arrangement for interleaving a digital signal in which samples are delayed by an integral number times a unit delay in accordance with a cyclically repeated delay pattern, comprising:

means for cyclically activating parallel-arranged select lines of a memory at a cycle rate which is equal to the unit delay;

means for writing to the memory during an activation of a select line, which data includes a relevant bit of each sample to be delayed in an integral number of sample groups, a sample group being associated with one delay pattern cycle; and means for reading from the memory during the activation of the select line, a number of bits which is equal to the number of bits written, the bits being read in accordance with the delay pattern;

and in which the data is read and written into the same memory location in one cycle.

9. A memory control unit comprising:

means for cyclically activating parallel-arranged select lines of a memory at a cycle rate which is equal to a unit delay;

means for writing to the memory during one activation of a select line, a relevant bit of each sample to be delayed in an integral number of sample groups, a sample group being associated with one delay pattern cycle; and means for reading from the memory during the one activation of the select line, a number of bits which is equal to the number of bits written, the bits being read in accordance with the delay pattern;

and in which, data is both written to and read from the memory during consecutive select line activations of the cyclic activations of the select lines for each repeated delay pattern.

10. A memory control unit comprising:

means for cyclically activating parallel-arranged select lines of a memory at a cycle rate which is equal to a unit delay;

means for writing to the memory during one activation of a select line, a relevant bit of each sample to be delayed in an integral number of sample groups, a sample group being associated with one delay pattern cycle; and means for reading from the memory during the one activation of the select line, a number of bits which is equal to the number of bits written, the bits being read in accordance with the delay pattern;

and in which the data is read and written into the same memory location in one cycle.

* * * * *

UNITED STATES PATENT AND TRADEMARK OFFICE
CERTIFICATE OF CORRECTION

PATENT NO.    : 6,424,680 B1
DATED         : July 23, 2002
INVENTOR(S)   : Delaruelle et al.

It is certified that error appears in the above-identified patent and that said Letters Patent is hereby corrected as shown below:

<u>Title page,</u>
Item [*] Notice, delete "0" and insert -- 785 --.

Signed and Sealed this

First Day of July, 2003

JAMES E. ROGAN
*Director of the United States Patent and Trademark Office*